United States Patent [19]

Sato

[11] Patent Number: 4,755,747
[45] Date of Patent: Jul. 5, 1988

[54] WAFER PROBER AND A PROBE CARD TO BE USED THEREWITH

[75] Inventor: Mitsuya Sato, Yokohama, Japan

[73] Assignee: Canon Kabushiki Kaisha, Tokyo, Japan

[21] Appl. No.: 743,818

[22] Filed: Jun. 12, 1985

[30] Foreign Application Priority Data

Jun. 15, 1984 [JP] Japan .................................. 59-121986
Jun. 19, 1984 [JP] Japan .................................. 59-124525

[51] Int. Cl.$^4$ ................................................ G01R 31/02
[52] U.S. Cl. ............................. 324/158 F; 324/158 P
[58] Field of Search ........... 324/158 F, 158 P, 73 PC, 324/72.5

[56] References Cited

U.S. PATENT DOCUMENTS 3,405,361 10/1968 Kattner et al. .................. 324/158 P

FOREIGN PATENT DOCUMENTS 2641181 1/1978 Fed. Rep. of Germany ... 324/73 PC

*Primary Examiner*—Ernest F. Karlsen
*Attorney, Agent, or Firm*—Fitzpatrick, Cella, Harper & Scinto

[57] ABSTRACT

A probing apparatus for use in examination of a chip formed on a wafer, the probing apparatus including a holder for holding the wafer, a support for supporting a sheet-like member having a probe to be contacted to the chip on the wafer, a driving unit for displacing the wafer relative to the sheet-like member, and a detecting system for reading a record carried on the sheet-like member. In another aspect of the invention, there is provided a probe card for use in examination of a tip formed on a wafer, the probe card including a flat plate member having an aperture, a plurality of fine conductive members each extending from a peripheral portion of the flat plate member around the aperture toward a central portion of the aperture, each of the fine conductive members having a free end extending beyond one of the surfaces of the flat plate member, and a record carried on the flat plate member and capable of being sensed from a sensor disposed opposed to the one surface.

6 Claims, 3 Drawing Sheets

WAFER PROBER AND A PROBE CARD TO BE USED THEREWITH

BACKGROUND OF THE INVENTION

This invention relates to a probing apparatus and, more particularly, to a wafer prober for use in the examination of electrical characteristics of semiconductor devices formed on a wafer, during the manufacture of such semiconductor devices. In another aspect, the invention is concerned with a probe card to be used with the probing apparatus.

Usually in the field of manufacture of semiconductor devices such as integrated circuits (ICs), and during one of the final stages of the manufacture, the electrical characteristics of respective semiconductor devices, called IC chips, formed on a silicon wafer or the like are examined. Such examination is normally effected prior to cutting the wafer to divide the same into respective IC chips. For the sake of such examination, an integrated-circuit tester, called an IC tester, and a probing apparatus, called a wafer prober, are used. The examination itself of the electrical characteristics of each of the IC chips is carried out actually by the IC tester, and the wafer prober is used in order to establish an electrical connection between the IC tester and each of the IC chips on the wafer. An example of such wafer prober is disclosed in Japanese Laid-Open Utility Model Application, Laid-Open No. 53149/1983.

For the examination, a wafer having formed thereon a number of IC chips, to be tested, is disposed on a wafer stage of the probing apparatus. The wafer stage is movable in the directions of X, Y and Z. On the other hand, a probe card associated with the wafer to be tested is introduced into the probing apparatus and then is held by a holder for rotational displacement in an X-Y plane. The probe card has mounted thereon a plurality of probe needles with tips. The number of the probe needles and the positions of the needle tips correspond respectively to the number and the locations of bonding pads of each IC chip on the wafer. The bonding pad is the area defined on the IC chip to which a bonding wire is to be connected at a later stage during the manufacture of the semiconductor devices.

The probe card and the wafer stage, carrying the wafer, are relatively displaced so that the tips of the probe needles are aligned with the bonding pads of one of the IC chips which is now going to be examined. Subsequently, the wafer stage is moved upwardly in the Z direction until the tips of the probe needles contact the bonding pads of the IC chip, respectively. By thus bringing the needle tips into contact with the bonding pads, the IC chip is electrically connected to the IC tester so that the examination of the electrical characteristics of the IC chip is carried out.

Upon completion of the examination, the wafer stage is moved stepwise relative to the probe card so that a second IC chip is examined in a similar manner. This is repeated until all the remaining IC chips are examined. Thereafter, the wafer is replaced by a second wafer and similar examination operations are carried out relative to the second wafer.

If the examination is to be made relative to different IC chips having different patterns (and thus having different geometrical arrangements of bonding pads), separate probe cards having different arrangements of probe needles are interchangingly used.

In any event, in order that the probe needles of the probe card are brought into correct contact with the bonding pads of the IC chip, respectively, an accurate alignment must be achieved between the probe card and the wafer (i.e. between the tips of the probe needles and the bonding pads) after they are introduced into the probing apparatus.

The alignment operation in the known type probing apparatuses will now be described. Usually, the alignment is effected through two steps, prealignment (coarse alignment) and final alignment (fine alignment).

The wafer prealignment is a step for coarsely positioning the wafer relative to the probing apparatus or the probe card. As an example, the wafer prealignment is carried out by mechanical positioning. Alternatively, a sensor is used to detect the edge of the wafer to thereby detect the outer periphery of the wafer and the direction of elongation of an orientation flat of the wafer. In accordance with the results of detection, the rotational position of the wafer is adjusted. By the wafer prealignment, the wafer is coarsely positioned so that its orientation flat extends in a desired direction relative to the probing apparatus.

After the wafer prealignment, the final or fine alignment of the wafer relative to the probe card is effected. As for a first wafer, the same is moved manually so that a predetermined one of the IC chips on the first wafer is located under the probe needles. Subsequently, while observing the tips of the probe needles and the bonding pads of the IC chip through a microscope or the like, the probe card is manually displaced in the rotational direction to remove the positional deviation in the rotational direction between the probe card and the wafer (i.e. between the tips of the probe needles and the bonding pads of the IC chip). Then, while continuing the naked-eye observation, the wafer stage is manually displaced minutely in the X and Y directions to accurately align the bonding pads of the IC chip and the tips of the probe needles. When this is achieved, the alignment itself of the first wafer is completed.

In the event that the fine alignment relative to a second wafer, a third wafer, etc. is to be made automatically through the image processing, the following operations are carried out just after the completion of the fine alignment of the first wafer. That is, the first wafer to which the fine alignment is finished is moved so that a predetermined area on the first wafer is located at a position under a TV camera provided for the sake of the image processing. By doing so, the image of the pattern in the predetermined area on the wafer is picked up and the pattern is displayed in a cathode ray tube connected to the TV camera. Subsequently, of the pattern displayed, a desired or predetermined portion is selected and registered as a template. This template is used as a reference for detecting the position of each of the second wafer, the third wafer, etc. during the automatic fine alignment of these wafers.

The first wafer, after completion of the final alignment, is moved to an examination initiating position, and then the examination is carried out by contacting the tips of the probe needles to the bonding pads of the first IC chip, as described in the foregoing. After the examination of the first IC chip is completed, the wafer stage is moved stepwise in the X and Y directions so that a second IC chip, a third IC chip, etc. of the same wafer are examined.

As for the second wafer to be examined with the use of the same probe card, the prealignment of the second wafer is carried out in the same manner as of the first wafer. On the other hand, the fine alignment of the second wafer can be made automatically by the image processing as described before. For the sake of such automatic fine alignment, the second wafer which has been prealigned is moved so that a predetermined area on the second wafer is located at a position under the TV camera. Next, the image of the pattern in the predetermined area on the wafer is picked up and the pattern is compared with the template which has already been registered during the processing of the first wafer. By this pattern matching, the position of the second wafer relative to the probe card (probe needles) is detected. Any positional deviation between the probe card and the wafer, thus detected, is corrected by controlling the movement of the wafer stage for moving the wafer for the sake of the probing operation of the first IC chip.

In the known type wafer prober, as has been described, the final or fine alignment of the first wafer is effected manually, i.e. by manually changing the positional relation between the tips of the probe needles and the bonding pads of the IC chip while observing them. This is a complicated operation, requiring a prolonged examination time. As described hereinbefore, it is necessary to interchangingly use separate probe cards relative to different wafers having different chip patterns. Every time the probe card is replaced, such complicated fine alignment operation is necessary. Further, due to the physical contact between the tips of the probe needles and the bonding pads, the probe card needs to be demounted from the wafer prober, each time a certain number of wafers are processed, for the sake of cleaning and/or repair of the probe needles. When the cleaned or repaired probe card is introduced again into the wafer prober, the complicated manual fine alignment operation is required again.

On the other hand, in order to permit the prealignment operation, the probing operation, etc. to be effected automatically, it is necessary to preparatively set or specify various data relative to the probing apparatus. Examples of such data are as follows:

(1) Direction of orientation flat . . . It is necessary to specify the direction of elongation of the orientation flat of the wafer to be established by the prealignment operation relative to the probing apparatus or the probe card. By this, the sequence of the probing operations for all the chips on the wafer is determined.

(2) Index stroke . . . It is necessary to specify the index stroke, i.e. the amount of stepwise movement of the wafer stage for the probing operations relative to the IC chips on the wafer. The index stroke is determined by the size of each IC chip, the sequence of the probing operations, etc.

(3) Wafer edge percent . . . The wafer edge percent should be specified in order to determine those of the IC chips formed on a peripheral portion of the wafer that are to be probed or examined. In some cases, such IC chips as having incomplete areas, as compared with the area of the perfect IC chip, are formed on the outer peripheral portion of the wafer. There is a higher possibility that, among these incomplete IC chips, those as having areas not less than a predetermined area are satisfactorily operable as the semiconductor devices. In view of this, the examination of the electrical characteristics is carried out relative to each of those of the IC chips formed on the peripheral portion of the wafer which have areas not less than the predetermined area. The wafer edge percent is the proportion of the above-mentioned predetermined area to the area of the perfect IC chip. By specifying the wafer edge percent, whether or not the examination is to be made relative to an incomplete IC chip is determined.

(4) Alignment parameter . . . For the sake of fine alignment relative to the second wafer, the third wafer, etc., it is necessary to specify the location of the alignment area which is the subject of the pattern matching.

In the known type probing apparatuses, these data or conditions are inputted to the apparatus by manual handling of an operation panel by an operator. This is a complicated and time-consuming operation. Further, the set of these initial conditions is required every time the probe card is replaced by another for a different wafer having different chip pattern. Therefore, it requires exceedingly complicated operations as well as an enormously prolonged examination time. This is of course undesirable.

In order to obviate this problem, it has been proposed to provide the apparatus with a memory and to preparatively store various data in the memory. In such case, however, it is necessary to pay careful attention to the correlation between the wafer to be examined (i.e. the probe card to be used) and the data stored in the memory. Therefore, it still requires a manual operation by an operator each time the probe card is replaced.

SUMMARY OF THE INVENTION

It is accordingly a primary object of the present invention to provide an automatic probing apparatus arranged so that various data for allowing various automatic oprations are automatically inputted to the probing apparatus.

It is a second object of the present invention to provide an automatic probing apparatus arranged so that probe needles of a probe card and bonding pads of an IC chip of a wafer are automatically aligned with each other.

It is a third object of the present invention to provide an automatic probing apparatus arranged so that both the setting of various data for allowing various automatic operations and the alignment of a probe card with a wafer are automatically effected.

It is a fourth object of the present invention to provide a probe card, usable with a probing apparatus, arranged so that various data for allowing various automatic operations of the probing apparatus are inputted automatically into the probing apparatus.

It is a fifth object of the present invention to provide a probe card, usable with a probing apparatus, arranged so that the probe card and a wafer, when they are introduced into the probing apparatus, are automatically alinged with each other.

It is a sixth object of the present invention to provide a probe card, usable with a probing apparatus, arranged so that both the initial setting of various data for allowing various automatic operations of the probing apparatus and the alignment of the probe card and a wafer, when they are introduced into the probing apparatus, are effected automaticaly.

Briefly, according to the present invention, there is provided a probing apparatus for use in examination of a chip formed on a wafer, the probing apparatus including a holder for holding the wafer, a support for supporting a sheet-like member having a probe to be contacted to the chip on the wafer, a driving unit for displacing the wafer relative to the sheet-like member, and a detecting system comprising means for reading information recorded on the sheet-like member.

In another aspect of the invention, there is provided a probe card for use in examination of a tip formed on a wafer, the probe card including a flat plate member having an aperture, a plurality of fine conductive members each extending from a peripheral portion of the flat plate member around the aperture toward a central portion of the aperture, each of the fine conductive members having a free end extending beyond one of surfaces of the flat plate member, and a portion bearing information recorded on the flat plate member and capable of being sensed from a sensor disposed opposed to the one surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
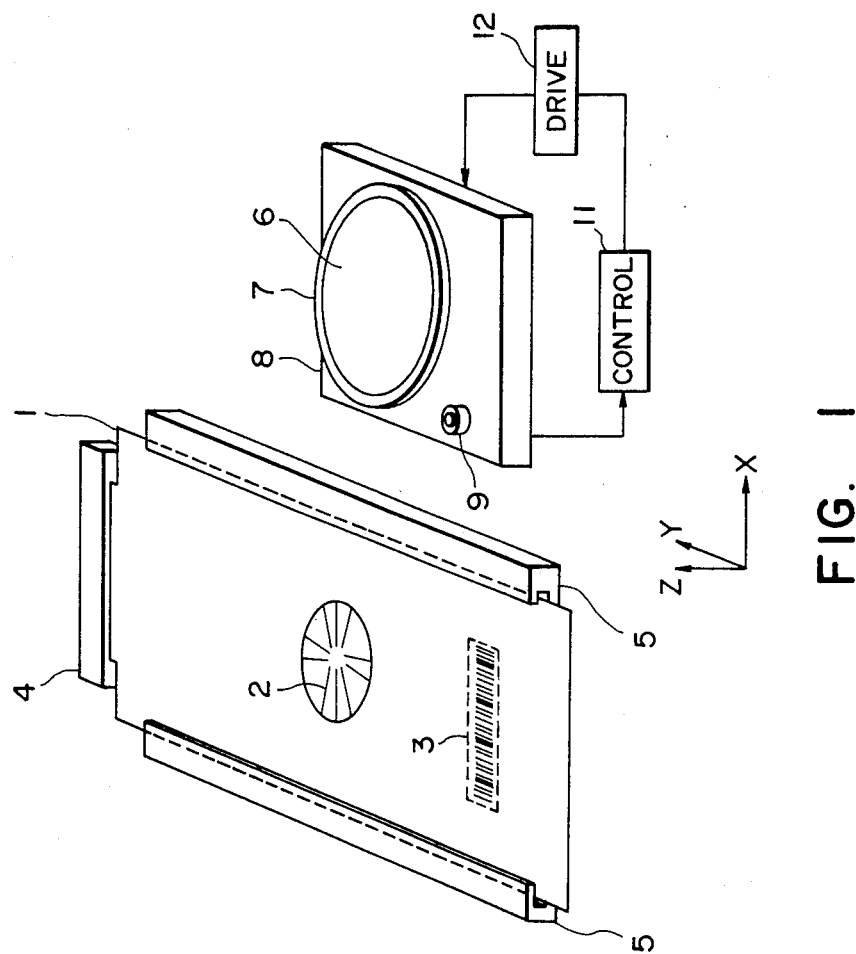
FIG. 1 is a perspective view schematically and diagrammatically showing a wafer prober according to an embodiment of the present invention and a prooe card, usable with the wafer prober, according to another aspect of the present invention.

Referring first to FIG. 1, there is shown a wafer prober according to an embodiment of the present invention, which prober is arranged so that the setting of initial conditions as described in the introductory part of the Specification is effected automatically. In FIG. 1, there is also shown a probe card according to another aspect of the present invention, which card is suitable to be used with the wafer prober illustrated.

As shown in FIG. 1, the probe card 1 includes a sheet-like or flat plate-like member having an aperture of substantially circular shape formed at a position substantially in the middle of the sheet-like member in its widthwise direction (X direction). The probe card 1 is provided with a plurality of fine conductive probe needles 2 mounted on the peripheral portion of the sheet-like member around the aperture. The probe needles 2 extend generally toward the central portion of the aperture from the peripheral portion of the aperture and have their tips extending downwardly in the direction Z beyond the lower surface of the probe card 2. The tips of the probe needles 2 correspond to the locations of the bonding pads of each IC chip on the wafer to be examined with the use of the probe card 1.

The probing apparatus includes a card holder 5 rotatably connected to an unshown housing of the probing apparatus. The card holder 5 is adapted to hold the probe card 1 when the latter is introduced into the probing apparatus. The probing apparatus further includes a card edge connector 4 which is electrically connected to an unshown IC tester. The connector 4 is adapted to be connected to a side edge of the probe card 1 when the latter is introduced into the probing apparatus. When this is achieved, the probe needles 2 of the probe card 1 are electrically connected to the IC tester.

The probing apparatus further includes a wafer stage 8 disposed within the unshown prober housing. The wafer stage 8 is connected to a known type driving unit 12, which is illustrated diagrammatically in this Figure, so that the wafer stage 8 is movable in the directions of X, Y and Z. Mounted on the wafer stage 8 is a wafer chuck 7 for holding a wafer 6 by vacuum suction or the like. Thus, the wafer chuck 7 is movable with the wafer stage 8 in the directions of X, Y and Z. During the probing operation, the wafer stage 8 is moved in the X and Y directions to move the wafer 6 to a position under the probe needles 2. Subsequently, the wafer stage 8 is moved upwardly in the Z direction so that the bonding pads of one IC chip are brought into contact with the tips of the probe needles 2. By this, that one IC chip is electrically connected to the unshown IC tester so that the electrical characteristics of that IC chip are examined.

The probe card 1 shown in FIG. 1 has formed on its lower surface bar-code signs 3 (shown by a phantom-line block in FIG. 1) wherein various data have been recorded. These data are chiefly concerned with the information on the wafer to be examined through the probe card 1, including various conditions of the wafer to be initially set within the probing apparatus, such as the direction of orientation flat, the index stroke, the wafer edge percent, alignment parameter, etc. In the FIG. 1 embodiment, the bar code signs 3 are arranged into an array extending in the X direction.

In relation to the bar code signs 3 formed on the probe card 1, the probing apparatus is provided with a reflection type photosensor 9 such as a fiber optic sensor, for reading the bar code signs 3. The photosensor 9 is fixedly secured on the wafer stage 8 and is connected to a control unit 11, diagrammatically shown in this Figure, to read out the record in the bar code signs 3. The control unit 11 is connected to the driving unit 12 which is connected to the wafer stage 8, to control the driving unit 12 to thereby control the movement of the wafer stage 8.

For reading the record, the wafer stage 8 is moved in the X direction relative to the probe card 1 so that the bar code signs 3 formed on the lower surface of the probe card 1 are optically scanned by the photosensor 9 disposed on the wafer stage 8 and opposed to the bar code signs 3. By doing so, the various data recorded in the bar code signs 3 are read out. In accordace with the data now read out, the control unit 11 automatically controls the wafer stage movement during, as an example, the probing operation in relation to, e.g., the amount and the direction of the stepwise movement of the wafer stage.

As for the data to be recorded in the bar code signs 3 of the probe card 1, the number of the probe card 1 may be included in addition to the information inherent to the wafer to be tested. In such case, whether or not the selected probe card has a correlation to the wafers to be tested is determined by reading the number of the probe card recorded in the bar code signs 3. Further, the characteristics of the probe card such as an error of the contact pressure between the probe needles and the bonding pads due to any error caused during the manufacture of the probe card may be recorded in the bar code signs 3.

In the embodiment of FIG. 1, bar code signs are used as the data recording medium, while a reflection type photosensor is used as the data reading means. However, the invention is not limited thereto. In place of the bar code signs 3, the probe card 1 may be provided with a magnetic tape for magnetically recording therein various data and, on the other hand, the photosensor 9 of the wafer stage 8 may be replaced by a magnetic head. In such case, the data recorded on the magnetic tape can be read out by moving the magnetic head relative to the magnetic tape on the probe card. Since the recorded information is easily rewritable in the case of magnetic recording, use of the magnetic recording may be preferable so that the latest data such as, for example, data for controlling the amount of displacement of the wafer stage in the Z direction to correct any change in the contact pressure of the probe needles due to the fatigue or the like can be easily recorded.

It will be understood from the foregoing that this embodiment of the present invention attains automatization of the setting of various initial conditions for the wafer prober, which have conventionally been carried out by complicated manual operations, at the time of starting the examination operation or upon replacement of the probe card in response to a change of the kinds of the IC chips. In addition, the time required for the examination can be reduced significantly. Moreover, such automatization can be realized only by simple modifications, i.e. by preparatively recording on the probe card the information necessary for the wafer prober and by providing the wafer prober with means for reading the record carried on the probe card. Where the reading means such as a photosensor is disposed on a wafer stage which is displaceable relative to the probe card, as in the present embodiment, no additional driving mechanism is required to read the record on the probe card. In a case where the wafer stage is displaced relative to the probe card, prior to the probing operation, in order to detect the position of the probe card, the photosensor 9 may read the bar code signs 3 during such displacement of the wafer stage relative to the probe card. In such case, no additional scanning movement of the wafer stage 8 is necessary.

Figure 2:
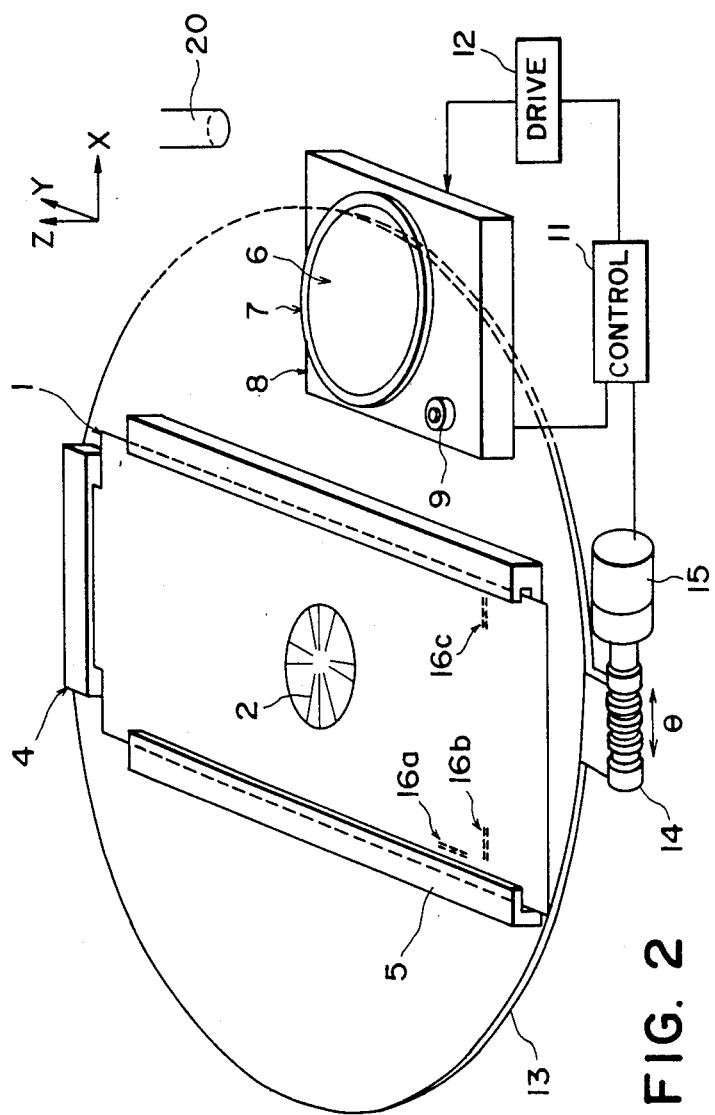
FIG. 2 is a perspective view schematically and diagrammatically showing a wafer prober according to another embodiment of the present invention and a probe card, usable with the probing apparatus, in accordance with a further aspect of the present invention.

Referring to FIG. 2, there is shown a wafer prober according to another embodiment of the present invention, which prober is arranged so that the fine alignment between the probe card and the wafer is achieved automatically. In FIG. 2, there is also shown a probe card according to another aspect of the present invention, which card is suitable to be used with the wafer prober shown in this Figure. In the present embodiment, the elements having functions similar to those of the elements of the FIG. 1 embodiment are denoted by the same reference numerals, respectively.

The probe card 1 includes a sheet-like or flat plate-like member having an aperture of substantially circular shape formed at a position substantially the middle of the sheet-like member in its widthwise direction (X direction). The probe card 1 is provided with a plurality of fine conductive probe needles 2 mounted on the peripheral portion of the sheet-like member around the aperture. The probe needles 2 extend generally toward the central portion of the aperture from the peripheral portion of the aperture and have their tips extending downwardly in the direction Z beyond the lower surface of the probe card 2. The tips of the probe needles 2 correspond to the locations of the bonding pads of each IC chip on the wafer to be examined with the use of the probe card 1.

The probing apparatus includes a card holder 5 rotatably connected to an unshown housing of the probing apparatus through a rotatable frame 13. The card holder 5 is adapted to hold the probe card 1, when the latter is introduced into the probing apparatus, so that the center of the aperture of the probe card 1 substantially coincides with the center of rotation of the rotatable frame 13. The rotatable frame 13 has a substantially circular outer shape and has a window by which the lower surface of the probe card 1 when it is held by the card holder 5 is exposed at least partially. A step motor 15 is fixedly secured to the unshown prober housing. The step motor 15 has an output shaft, on an end of which a worm gear 14 is provided. The worm gear 14 is in mesh engagement with a rack portion formed on the peripheral portion of the rotatable frame 13, so that rotation of the step motor 15 causes rotation of the rotatable frame 13 in the $\theta$ direction.

The probing apparatus further includes a card edge connector 4 which is secured to the rotatable frame 13 and is electrically connected to an unshown IC tester. The connector 4 is adapted to be connected to a side edge of the probe card 1 when the latter is introduced into the probing apparatus. When this is achieved, the probe needles 2 of the probe card 1 are electrically connected to the IC tester.

The probing apparatus further includes a wafer stage 8 disposed within the unshown prober housing. The wafer stage 8 is connected to a known type driving unit 12, which is illustrated diagrammatically in this Figure, so that the wafer stage 8 is movable in the directions of X, Y and Z. Mounted on the wafer stage 8 is a wafer chuck 7 for holding a wafer 6 by vacuum suction or the like. Thus, the wafer chuck 7 is movable with the wafer stage 8 in the directions of X, Y and Z. During the probing operation, the wafer stage 8 is moved in the X and Y directions to move the wafer 6 to a position under the probe needles 2. Subsequently, the wafer stage 8 is moved upwardly in the Z direction so that the bonding pads of one IC chip are brought into contact with the tips of the probe needles 2. By this, that one IC chip is electrically connected to the unshown IC tester so that the electrical characteristics of that IC chip are examined.

On the lower surface of the probe card 1, there are formed a plurality of bar-like alignment marks 16a, 16b and 16c (shown by phantom lines in FIG. 2) to be used for the sake of alignment of the probe card. Each of the alignment marks 16a–16c has a reflection factor different from that of the lower surface of the probe card 1. Also each of the alignment marks is formed in a predetermined positional relation to the tips of the probe needles 2, more particularly, in a predetermined relation with respect to the distance from the needle tips and the direction relative to the needle tips. In many cases, the bonding pads of each IC chip are arrayed substantially in parallel to two orthogonal straight lines, so that the tips of the probe needles are located, accordingly, substantially in parallel to two orthogonal straight lines. In such cases, to facilitate the alignment between the bonding pads of each IC chip and the tips of the probe needles, it is preferable to hold the wafer so that the orthogonally arrayed arrangement of the bonding pads of each IC chip matches with or is in alignment with the X and Y axes which are the directions of movement of the wafer stage, and also to hold the probe card so that the orthogonally arrayed arrangement of the needle tips matches with or is in alignment with the X and Y axes. From this viewpoint, in the present embodiment, the alignment marks 16a-16c are formed on the probe card 1 in such manner that the alignment mark 16a extends along one of the two orthogonal lines which are in parallel to the directions of the arrays of the needles tips, while the alignment marks 16b and 16c extend along the other of the two orthogonal lines. In addition, these alignment marks are so formed that, when the probe card 1 is introduced into the probing apparatus and is held by the holder 5, the alignment mark 16a is roughly positioned in the direction of the Y axis of the wafer stage 8, while the alignment marks 16b and 16c are roughly positioned in the direction of the X axis of the wafer stage 8.

In relation to the alignment marks 16a-16c formed on the probe card 1, the probing apparatus is provided with a reflection type photosensor 9 such as a fiber optic sensor for reading or detecting these alignment marks by optical scanning. The photosensor 9 is fixedly secured on the wafer stage 8 and is connected to a control unit 11, diagrammatically shown in FIG. 2, to obtain the positional information on the probe card 1 from the alignment marks 16a-16c, as will be described later. The control unit 11 is connected to the driving unit 12 which is connected to the wafer stage 8, to control the drive unit 12 to thereby control the movement of the wafer stage. The control unit 11 is connected also to the step motor 15 to control the drive thereof to thereby control the rotation of the rotatable frame 13.

The probing apparatus is further provided with a TV camera 20 which is disposed adjacent to the wafer stage 8 and which is usable for the sake of wafer fine alignment. The TV camera 20 is connected to an unshown cathode ray tube and to an image processing unit provided in the control device 11.

The alignment operation in the FIG. 2 embodiment will now be described in detail.

As described hereinbefore, the probe card 1 when it is held by the holder 5 is coarsely positioned so that the alignment marks 16a-16c are roughly aligned with the X and Y axes of the wafer stage 8. Thereafter, the wafer stage 8 is moved by the driving unit 12 in the directions of X and Y so as to scan the alignment marks 16a-16c formed on the probe card 1 with the photosensor 9 disposed on the wafer stage 8 and opposed to these alignment marks. By this, the position of the probe card 1 with respect to the X and Y coordinates of the wafer stage 8 is detected. More specifically, since the photosensor 9 is fixedly secured on the wafer stage 8, it is at a fixed position or point in the X and Y coordinates of the wafer stage. Therefore, by scanning with such photosensor 9 the alignment mark 16a of the probe card 1 in the X direction, the position in the X direction of the alignment mark 16a with respect to the wafer stage 8 is detectable from the amount of displacement of the wafer stage 8 in the X direction. Similarly, by scanning with the photosensor 9 each of the alignment marks 16b and 16c in the Y direction, the position in the Y direction of each of the alignment marks 16b and 16c with respect to the wafer stage 8 is detectable. Since the distance between the alignment marks 16b and 16c is predetermined, any positional error in the rotational direction ($\theta$ direction) of the probe card 1 with respect to the X and Y coordinates of the wafer stage is obtainable by calculation, on the basis of the distance between the alignment marks 16b and 16c and the position in the Y direction of each of these alignment marks 16b and 16c. These calculations are carried out in the control unit 11 connected to the photosensor 9.

In accordance with the thus obtained positional error of the probe card 1 in the rotational direction, the control device 11 applies an instruction signal to the step motor 15 to rotate the rotatable frame 13, whereby the positonal error of the probe card 1 in the rotational direction is corrected.

The position in the X or Y direction of each of the alignment marks 16a-16c relative to the wafer stage 8 after correction of the positional error of the probe card 1 in the $\theta$ direction is obtainable by calculation. Preferably, however, the alignment marks 16a-16c are again scanned by the photosensor 9 in the X and Y directions after correction of the positional error of the probe card 1 in the rotational direction, in order to detect again the position of each of the alignment marks with respect to the X and Y coordinates of the wafer stage 8.

Since each of the alignment marks 16a-16c is in the predetermined positional relation to the tips of the probe needles, as described hereinbefore, the relative position of the tips of the probe needles to the wafer stage 8 can be detected by measuring the position of each of the alignment marks 16a-16c with respect to the coordinates of the wafer stage 8.

As for a first wafer, such as the wafer 6, the prealignment of the same is effected automatically essentially in the same manner as described in the introductory part of the Specification, i.e. by mechanical positioning or by detecting the peripheral edge of the wafer with a wafer edge sensor. By this wafer prealignment, the wafer 6 is coarsely positioned on the wafer stage 8 so that the direction of elongation of the orientation flat of the wafer and thus the array of the bonding pads of each IC chip are substantially coincident with a desired direction. In the present embodiment, the wafer 6 is coarsely positioned by the wafer prealignment so that the bonding pads of each IC chip extending in two orthogonal directions are substantially aligned with the X and Y axes of the wafer stage 8.

The fine alignment of the first wafer 6 is achieved with the use of the TV camera 20. For this purpose, the wafer stage 8 is moved in the X and Y directions so that a predetermined area on the wafer 6 is positioned within the view field of the TV camera 20. Then, the image of the pattern in the predetermined area is picked up by the TV camera 20 and the pattern thus picked up is displayed in the unshown cathode ray tube connected to the TV camera 20. Subsequently, while observing through the cathode ray tube, the wafer stage is displaced minutely so that, within the display of the cathode ray tube, a predetermined portion of the bonding pads of the IC chip is accurately aligned with one or more reference lines which have been preparatively formed within the display of the cathode ray tube. In this embodiment, two orthogonally intersecting straight lines accurately corresponding to the X and Y axes of the wafer stage are used as the reference lines.

The fine positioning of the first wafer is completed when the predetermined portion of the bonding pads of the IC chip becomes coincident with the reference lines. Thereafter, for the sake of fine alignment relative to a second wafer, a third wafer, etc., a desired or predetermined portion of the pattern displayed in the cathode ray tube is registered in a memory of the image processing system as the template.

The location of each reference line within the display of the cathode ray tube is fixed with respect to the coordinates of the wafer stage. Further, the position of the probe card, i.e. the position of the tips of the probe needles, with respect to the coordinates of the wafer stage is obtainable in the manner as described hereinbefore. For these reasons, when the bonding pads of the IC chip are aligned with the reference lines in the display of the cathode ray tube, the amount of displacement of the wafer stage 8 in the X and Y directions necessary for moving a first IC chip, which is to be examined first, accurately to the probing position below the probe needles 2 (at which position the bonding pads of the first IC chip are accurately aligned with the tips of the probe needles) is obtainable by calculation. This calculation of the amount of displacement of the wafer stage 8 is effected in the control unit 11.

In accordance with the results of calculation, the control unit 11 controls the driving unit 12 to move the wafer stage 8 in the X and Y directions so as to locate the first IC chip at the probing position under the probe needles. Subsequently, the wafer stage 8 is moved upwardly in the Z direction so that the bonding pads of the first IC chip are brought into contact with the tips of the probe needles.

As for the second wafer, the prealignment thereof is effected in the same manner as of the first wafer. For the fine alignment, the second wafer having been prealigned is moved to a position below the TV camera 20 so that the image of a predetermired area on the second wafer is picked up by the TV camera 20. By comparing the pattern thus picked up with the template which has been registered in relation to the first wafer, the position of the second wafer with respect to the template having a fixed position relative to the wafer stage 8 is detected. On the basis of the result of detection and from the position of the probe card 1 with respect to the coordinates of the wafer stage 8, the amount of displacement of the wafer stage 8 necessary for moving a first IC chip of the second wafer, which is to be examined firstly, accurately to the probing position is detectable.

The fiber sensor usable as the reflection type photosensor 12 usually has repetition accuracies of the order of approx. 1 micron. Therefore, satisfactory accuracies are assured for the positioning of the probe card.

If the probe card 1 is demounted from the probing apparatus for the purpose of cleaning, repair, etc., and when the same probe card is introduced again into the probing apparatus, the card-to-wafer alignment can be achieved very easily, as in the following manner. First, the alignment marks 16a–16c of the probe card 1 after it is introduced again into the wafer prober are scanned by the photosensor 9, to detect the position of the probe card 1 with respect to the coordinates of the wafer stage 8. Thereafter, the step motor 15 is actuated to remove any positional error of the probe card 1 in the θ direction. Since, as for the wafers, the template for the sake of pattern matching has been registered in relation to the first wafer, the position of each of the wafers to be probed by the probe card 1 introduced again into the probing apparatus is detected with the use of the template. The amount of displacement of the wafer stage for the probing operation can be calculated in the manner as described hereinbefore.

In a case where only a limited tolerance is permitted with respect to the positional relation between the tips of the probe needles and the alignment marks 16a–16c, or in a case where such positional relation is liable to be changed due to deformation of the needles or other reasons, the control unit 11 may be provided with a writable or rewritable memory to store therein the actual positional relation between the needle tips and the alignment marks, to thereby adjust or control the position detection for the probe card and the driving movement of the step motor 15 and the wafer stage 8.

Figure 3:
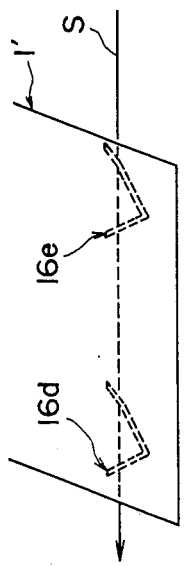
FIG. 3 is a fragmentary and perspective view showing a probe card according to another embodiment of the present invention.

In the embodiment shown in FIG. 2, separate alignment marks are provided for the purpose of position detection of the probe card 1 with respect to the X and Y directions, respectively. In place of these alignment marks, those such as shown in FIG. 3 may be used. That is, the probe card 1' shown in FIG. 3 has formed on its lower surface two alignment marks 16d and 16e each having two bar-like elements connected at a right angle to each other. These alignment marks 16d and 16e are so formed on the probe card 1' that they are aligned with each other with respect to a scanning line S which is to be established when the probe card 1' is scanned by a photosensor such as the photosensor 9 of FIG. 2 embodiment. With this arrangement, the position of the probe card 1' with respect to the coordinates of the wafer stage can be detected only a single scanning operation by the photosensor in only one direction (X direction). Therefore, the time required for the positioning of the probe card 1 can be reduced significantly.

In each of the FIG. 2 embodiment and the FIG. 3 embodiment, one set of alignment marks are used to detect the position of the probe card. Where plural sets of alignment marks are used, more accurate alignment between the probe needles and the bonding pads of each IC chip is possible even if the probe card is deformed for any reason.

In accordance with the above-described aspect of the present invention, the positioning of the probe card and therfore the alignment of the probe card with the wafer, which have conventionally required complicated manual operations, can be made automatically. Further, such automatization is attainable with simple modifications, i.e. by providing the probe card with alignment marks and by providing the probing apparatus with a detector, such as a photosensor, for detecting the alignment marks. Where, as in the disclosed embodiments, the detector is disposed on the wafer stage which is displaceable relative to the probe card, no additional driving mechanism is required to scan the alignment marks with the detector. By the automatization attainable with the present invention, the time required for the examination of the IC chips can be reduced.

Figure 4:
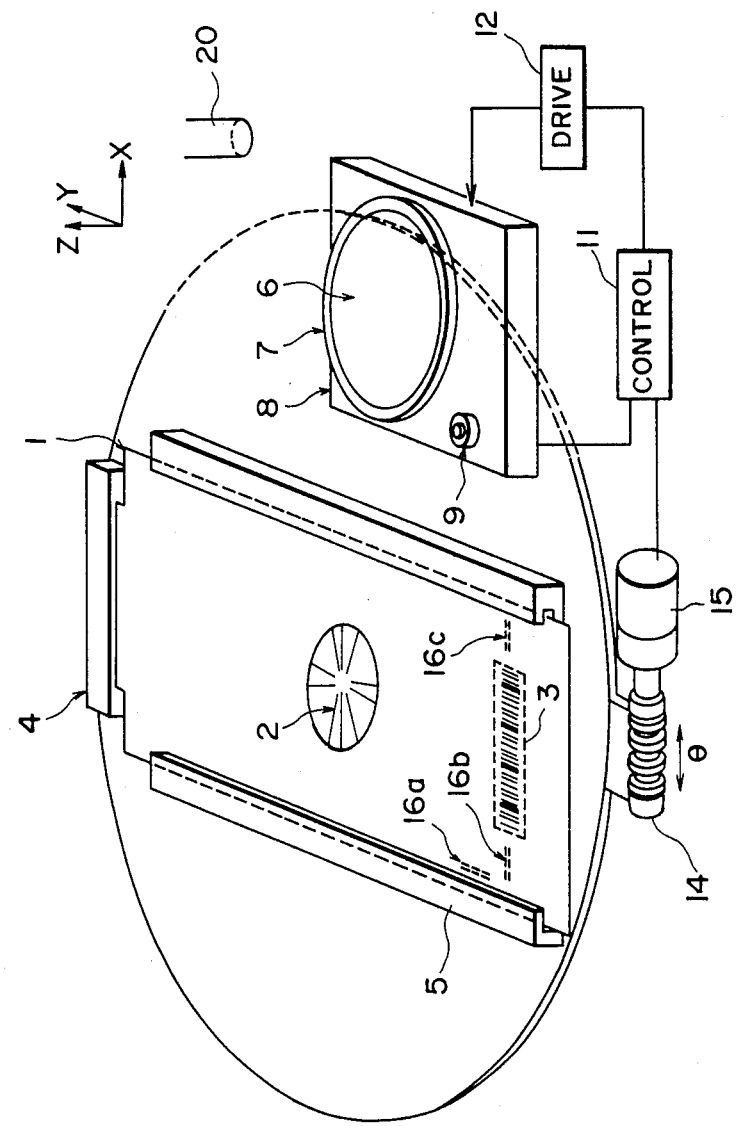
FIG. 4 is a perspective view schematically and diagrammatically showing a wafer prober according to a still further embodiment of the present invention and a probe card, usable with the wafer prober, according to a still further aspect of the present invention.

FIG. 4 shows a further embodiment of the present invention which is a modification of the FIG. 2 embodiment. More specifically, the present embodiment is a combined form of the FIG. 2 embodiment with the FIG. 1 embodiment.

In the present embodiment, a probe card 1 has formed on its lower surface bar code signs 3 as well as alignment marks 16a–16c. Similarly to the FIG. 1 embodiment, the bar code signs 3 contain various information such as the data necessary for various automatic operations. On the other hand, each of the alignment marks 16a–16c is formed with a predetermined positional relation to the tips of probe needles 2 of the probe card 1, as in the FIG. 2 embodiment. The alignment marks 16a–16c and the bar code signs 3 are scanned and read by a common photosensor such as a fiber optic sensor 9 fixedly secured on a wafer stage 8 of the probing apparatus and disposed opposed to the alignment marks and the bar code signs. By this, both the alignment of the probe card 1 relative to a wafer 6 and the setting of various initial conditions within the probing apparatus for the purpose of various automatic operations can be achieved automatically. Except for the above-described points, the structure of the present embodiment is the same as that of the FIG. 2 embodiment, so the detailed description thereof is omitted herein by assigning the same reference numerals to the corresponding elements.

In the present embodiment, where the bar code signs 3 contain a record concerning the relative position of each of the alignment marks 16a–16c to the tips of the probe needles 2, as described with reference to the FIG. 2 embodiment, it is no more necessary to add to the control unit 11 a memory for storing the actual positional relation between the alignment marks and the tips of the probe needles 2. In the event that the positional relation between the needle tips and the alignment marks is changed, e.g. by the deformation of the probe needles due to the fatigue with age or the like, the newly established positional relation can be recorded in the bar code signs 3.

While the invention has been described with reference to the structures disclosed herein, it is not confined to the details set forth and this application is intended to cover such modifications or changes as may come within the purposes of the improvements or the scope of the following claims.

What is claimed is:

1. A probing apparatus for use in the probing of chips formed on a wafer, said apparatus comprising:
    a movable stage for holding the wafer;
    means for holding a sheet-like member having a probe adapted, as said sheet-like member is held by said stage, to contact a chip on the wafer when said chip is placed at a probing position, wherein said sheet-like member includes a portion bearing information recorded thereon and related to the probing of said chips on the wafer;
    driving means for moving said movable stage so that said chips on the wafer held by said movable stage are moved in sequence to said probing position;
    reading means provided on said movable stage and movable with said movable stage, for reading said information recorded on said sheet-like member; and
    control means operable to control said driving means to cause said driving means to move said movable stage so that said reading means is moved to a position where said reading means reads said information recorded on said sheet-like member held by said movable stage.

2. An apparatus according to claim 1, wherein the recorded information on the sheet-like member includes a bar code sign and wherein said reading means includes an optical sensor capable of reading the bar code sign.

3. An apparatus according to claim 1, wherein said sheet-like member further comprises a magnetic portion, wherein the recorded information on the sheet-like member is contained in said magnetic portion of the sheet-like member and wherein said reading means includes a magnetic head for reading the recorded information contained in the magnetic portion of said sheet-like member.

4. An apparatus according to claim 1, wherein said recorded information relates to information for positioning said sheet-like member, wherein said information recorded on the sheet-like member includes an alignment mark and wherein said reading means includes an optical sensor for reading the alignment mark, whereby said sensor detects positional information on the sheet-like member.

5. An apparatus according to claim 4, wherein said recorded information on the sheet-like member includes a bar code sign and wherein said optical sensor of said reading means is also adapted to read the bar code sign.

6. An apparatus according to claim 1, wherein said control means is operable to control said driving means to move said movable stage so that said reading means scans and thereby reads said recorded information on said sheet-like member.

* * * * *

UNITED STATES PATENT AND TRADEMARK OFFICE
CERTIFICATE OF CORRECTION

PATENT NO. : 4,755,747

DATED : July 5, 1988

INVENTOR(S) : MITSUYA SATO

It is certified that error appears in the above-identified patent and that said Letters Patent is hereby corrected as shown below:

COLUMN 1

Line 58, "stepwisely" should read --stepwise--.

COLUMN 2

Line 64, "stepwisely" should read --stepwise--.

COLUMN 4

Line 53, "alinged" should read --aligned--.
    Line 61, "automaticaly." should read
        --automatically.--

COLUMN 5

Line 24, "prooe" should read --probe--.
    Line 62, "probe card 2." should read
        --probe card 1.--

COLUMN 6

Line 55, "accordace" should read --accordance--.

COLUMN 7

Line 6, "refletion" should read --reflection--.
    Line 22, "the fatigue" should read --fatigue--.
    Line 53, "aspact" should read --aspect--.

UNITED STATES PATENT AND TRADEMARK OFFICE
CERTIFICATE OF CORRECTION

PATENT NO. : 4,755,747

DATED : July 5, 1988

INVENTOR(S) : MITSUYA SATO

It is certified that error appears in the above-identified patent and that said Letters Patent is hereby corrected as shown below:

COLUMN 8

Line 2, "probe card 2." should read
        --probe card 1.--.

COLUMN 10

Line 11, "positonal" should read --positional--.

COLUMN 12

Line 28, "probe card 1" should read
        --probe card 1'--.

COLUMN 13

Line 16, "more" should read --longer--.
    Line 22, "the fatigue" should read --fatigue--.

Signed and Sealed this

Seventh Day of March, 1989

Attest:

DONALD J. QUIGG

Attesting Officer      Commissioner of Patents and Trademarks